US010096312B2

(12) United States Patent
Kumar et al.

(10) Patent No.: US 10,096,312 B2
(45) Date of Patent: Oct. 9, 2018

(54) NOISE CANCELLATION SYSTEM

(71) Applicant: Avnera Corporation, Beaverton, OR (US)

(72) Inventors: Amit Kumar, Beaverton, OR (US); Wai Laing Lee, Austin, TX (US); Jianping Wen, Beaverton, OR (US)

(73) Assignee: AVNERA CORPORATION, Beaverton, OR (US)

( * ) Notice: Subject to any disclaimer, the term of this patent is extended or adjusted under 35 U.S.C. 154(b) by 0 days.

(21) Appl. No.: 15/683,592

(22) Filed: Aug. 22, 2017

(65) Prior Publication Data

US 2018/0053497 A1 Feb. 22, 2018

Related U.S. Application Data

(63) Continuation of application No. 14/148,533, filed on Jan. 6, 2014, now Pat. No. 9,741,333.

(51) Int. Cl.
*H03B 29/00* (2006.01)
*G10K 11/178* (2006.01)

(52) U.S. Cl.
CPC .... *G10K 11/178* (2013.01); *G10K 2210/3016* (2013.01); *G10K 2210/3026* (2013.01); *G10K 2210/3027* (2013.01); *G10K 2210/3028* (2013.01); *H04R 2460/01* (2013.01)

(58) Field of Classification Search
CPC ......... G10K 11/178; G10K 2210/3016; G10K 2210/3026; G10K 2210/3027; G10K 2210/3028; H04R 2460/01
USPC ...... 381/56, 57, 71.1, 71.2, 71.4, 71.6, 71.8, 381/71.11, 71.12, 94.1, 95, 111, 119, 122, 381/12, 123; 700/94
See application file for complete search history.

(56) References Cited

U.S. PATENT DOCUMENTS

| | | | | |
|---|---|---|---|---|
| 7,619,551 | B1 | 11/2009 | Wu | |
| 9,224,382 | B2 * | 12/2015 | Clemow | G10K 11/178 |
| 9,824,677 | B2 * | 11/2017 | Kwatra | G10K 11/1784 |
| 2011/0007907 | A1 | 1/2011 | Hyun et al. | |
| 2012/0014532 | A1 * | 1/2012 | Kimura | H04R 1/1083 381/71.6 |
| 2014/0072134 | A1 | 3/2014 | Po et al. | |
| 2014/0072135 | A1 | 3/2014 | Bajic et al. | |
| 2014/0086425 | A1 | 3/2014 | Jensen et al. | |
| 2015/0281836 | A1 | 10/2015 | Nguyen et al. | |

* cited by examiner

*Primary Examiner* — Vivian Chin
*Assistant Examiner* — Friedrich W Fahnert
(74) *Attorney, Agent, or Firm* — Miller Nash Graham & Dunn LLP

(57) ABSTRACT

An adaptive noise canceling system can include a noise cancellation processor having an audio input for receiving an input audio signal, a microphone input structured to receive one or more microphone signals from a monitored environment, and a filter processor structured to produce a filtering function based on one or more filter parameters. The system can also include an adaptivity processor structured to change the one or more filter parameters in the noise cancellation processor based on a changing operating environment of the adaptive noise canceling system.

8 Claims, 8 Drawing Sheets

NOISE CANCELLATION SYSTEM

RELATED APPLICATIONS

This application is a continuation of co-pending U.S. patent application Ser. No. 14/148,533, filed Jan. 6, 2014, the content of which is herein fully incorporated by reference.

TECHNICAL FIELD

This disclosure is directed to noise cancellation, and, more specifically, to a system for multi-type active noise cancellation using a hybrid digital-analog design.

BACKGROUND

In general, noise that is present in a listening environment nearly always compromises the experience of listening to audio through headphones. For instance, in an airplane cabin, noise from the airplane produces unwanted acoustic waves, i.e., noise, that travel to the listener's ears, in addition to the audio program. Other examples include computer and air-conditioning noise of an office or house, vehicle and passenger noise in public or private transportation, or other noisy environments.

In an effort to reduce the amount of noise received by the listener, two major styles of noise reduction have been developed, passive noise reduction and active noise cancellation. Passive noise reduction refers to a reduction in noise caused by placing a physical barrier, which are commonly headphones, between the ear cavity and the noisy outside environment. The amount of noise reduced depends on the quality of the barrier. In general, noise-reduction headphones having more mass provide higher passive noise reduction. Large, heavy headphones may be uncomfortable to wear for extended periods, however. For a given headphone, passive noise reduction works better to reduce the higher frequency noise, while low frequencies may still pass through a passive noise reduction system.

Active noise reduction systems, also called active noise cancellation (ANC), refers to the reduction of noise achieved by playing an anti-noise signal through headphone speakers. The anti-noise signal is generated as an approximation of the negative of the noise signal that would be in the ear cavity in absence of ANC. The noise signal is then neutralized when combined with the anti-noise signal.

In a general noise cancellation process, one or more microphones monitor ambient noise or noise in the earcups of headphones in real-time, then generates the anti-noise signal from the ambient or residual noise. The anti-noise signal may be generated differently depending on factors such as physical shape and size of the headphone, frequency response of the speaker and microphone transducers, latency of the speaker transducer at various frequencies, sensitivity of the microphones, and placement of the speaker and microphone transducers, for example. The variations in the above factors between different headphones and even between the two ear cups of the same headphone system mean that that optimal filter design for generating anti-noise also vary.

Currently no Active Noise Cancellation system exists that can efficiently accommodate all of the variable factors to be considered when generating the anti-noise signal. For instance, digitizing the microphone signals and processing the signal at normal audio rates introduces large latency. Because the ANC performance depends on the ability to detect noise and produce the anti-noise signal soon enough in time to cancel the noise, a large latency is detrimental to ANC performance.

Embodiments of the invention address this and other limitations of the prior art.

DETAILED DESCRIPTION

Embodiments of the invention are directed to a system for Active Noise Cancellation.

Figure 1:
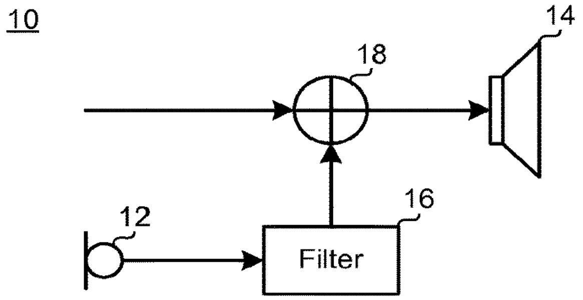
FIG. 1 is a circuit diagram illustrating conventional topology of feed-forward Active Noise Cancellation.

There are three major types of Active Noise Cancellation (ANC), which are distinguished based on microphone placement within the system. In feed-forward ANC, the microphone senses ambient noise but does not appreciably sense audio played back by the speaker. Such a system is illustrated in FIG. 1. With reference to FIG. 1, a feed-forward ANC system 10 includes a microphone 12 that senses ambient noise, but does not monitor the signal directly from a speaker 14. The output from the microphone 12 is filtered in a feed-forward filter 16 and the filter output coupled to a feed-forward mixer 18, where the filtered signal is mixed with an input audio signal. The filtered signal from the filter 16 is an anti-noise signal produced from the output of the microphone 12. When the anti-noise signal is mixed with the audio signal in the mixer 18, the output of the speaker 14 has less noise than if there were no anti-noise signal generated.

Figure 2:
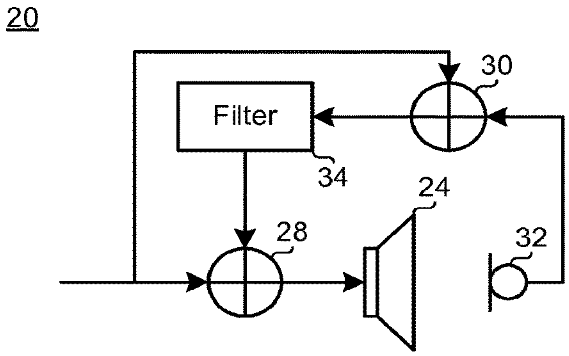
FIG. 2 is a circuit diagram illustrating conventional topology of feed-back Active Noise Cancellation.

In feedback ANC, the microphone is placed in a position to sense the total audio signal present in the ear cavity. In other words, the microphone senses the sum of both the ambient noise as well as the audio played back by the speaker. Such a system is illustrated in FIG. 2. With reference to FIG. 2, in a feedback ANC system 20, a microphone 32 directly monitors output from the speaker 24. The output from the microphone 32 is mixed with the audio input signal in a feedback mixer 30, and then the combined signal sent to a feedback filter 34 where the combined signal is filtered to produce an anti-noise signal. This anti-noise signal from the filter 34 is mixed with the original audio signal in a mixer 28, the combined output of which is then fed to the speaker 24. The feedback ANC system 20 also reduces the noise heard by the listener of the speaker 24.

Figure 3:
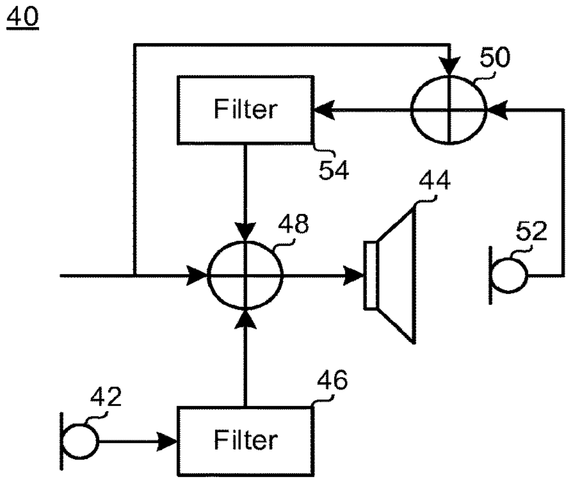
FIG. 3 is a circuit diagram illustrating conventional topology of a combined feed-forward and feed-back Active Noise Cancellation.

A combined feed-forward and feedback ANC system uses two microphones, a first placed in the feed-forward position as illustrated in FIG. 1, and a second in feedback position as illustrated in FIG. 2. A combined feed-forward and feedback ANC system 40 is illustrated in FIG. 3, and includes microphones 42, 52, and a speaker 44. A signal sensed from the feedback microphone 52 is mixed in a feedback mixer 50 and the combined signal filtered by a feedback mixer 54. Similarly, a signal sensed from the feed-forward microphone 42 is filtered in a feed-forward filter 46 and the filtered signal combined with the incoming audio signal in a feed-forward mixer 48. The output of the speaker 44 has reduced noise by the filtering and mixing operations.

Thus, there are different types of ANC that can be employed in a headphone, feed-forward, feedback, or a combined feed-forward and feedback ANC. As can be appreciated, different ANC systems for headphones also require different filter parameters due to variations in transducer characteristics. Even different earcups of the same headphone may benefit from independently optimized filters. Prior ANC designs were specially tuned with parameters specific to their particular implementation. Embodiments of the invention, conversely, include a system that may be adapted to use a common ANC solution for multiple solutions. By using a digital-analog hybrid design, system topology and filters are selected and implemented digitally in a programmable processor.

Whereas existing systems used fixed topologies and filters, embodiments of the invention use a selectable system to cover many different applications, as described in detail below.

Typical audio processing rates are 44.1 kHz or 48 kHz, which is based on the frequency range of typical human hearing. At these sample rates, the sampling time period is around 20 μs. The digitizing and the filtering in ANC systems invariably take multiple samples. At these rates, the resulting delay is in order of hundreds of microseconds. Because any delay in processing degrades generation of the anti-noise signal, this significantly lower ANC performance. This usually manifests itself as limiting the maximum noise frequency that may be cancelled.

Figure 4:
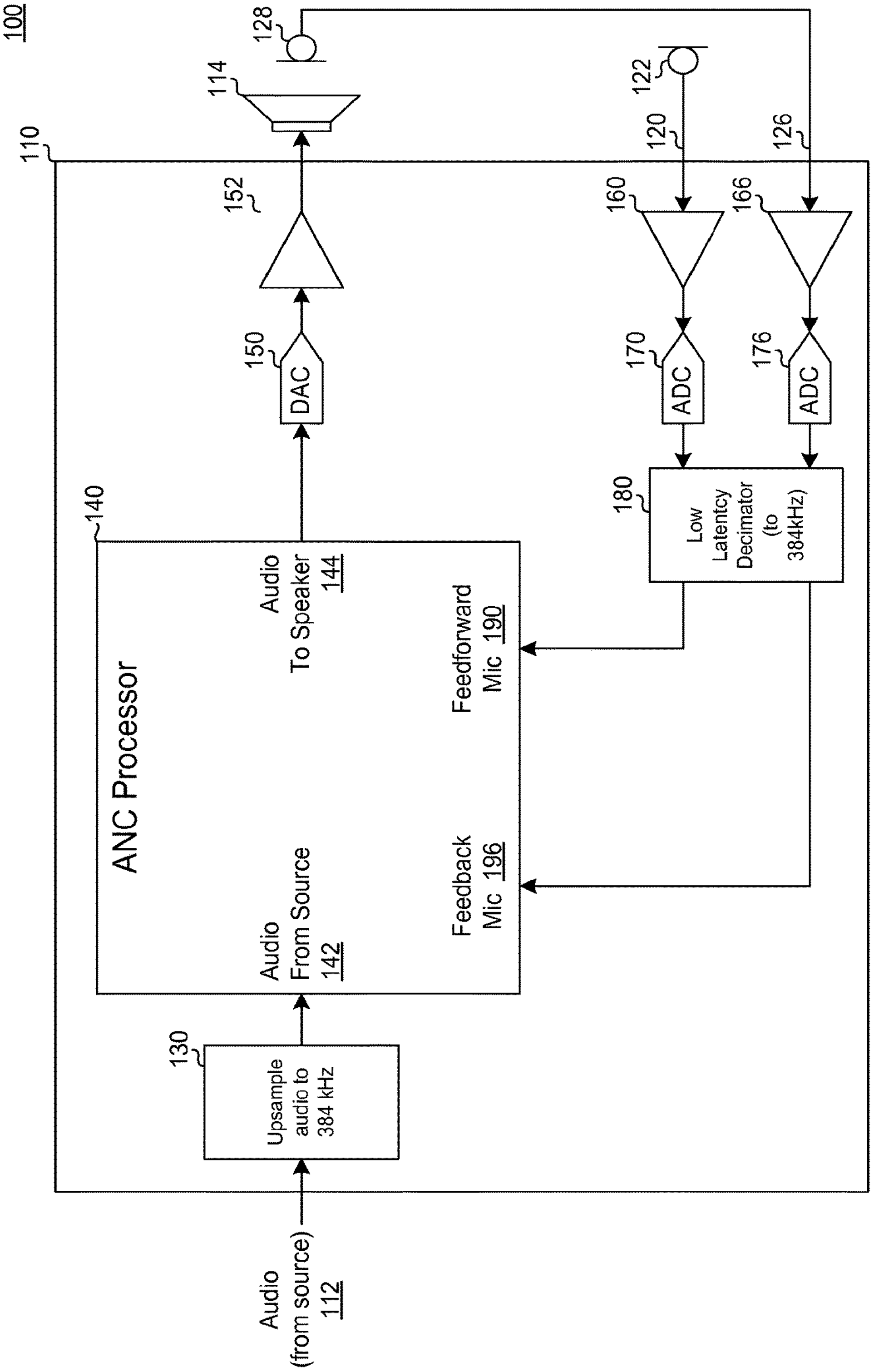
FIG. 4 is a block diagram of an Active Noise Cancellation system according to embodiments of the invention.

FIG. 4 is a block diagram of an Active Noise Cancellation system 100 according to embodiments of the invention. The ANC system 100 includes a main unit 110 into which an audio source 112 is introduced. The main unit also generates an ANC-compensated audio signal for a speaker 114. The main unit 110 receives at two inputs 120, 126, signals from a feed-forward microphone 122, and a feedback microphone 128, respectively. Some ANC systems may only include one input 120 or 126. For instance, in a system implemented for feedback ANC, only, then the feed-forward microphone 122 would not be present, nor any signal received at input 120. Similarly, for a system implemented for feed-forward, only, ANC, no feedback microphone 128 nor its signal at input 126 would be present.

After receiving the audio signal from the audio source 112, it is upsampled in an upsampling processor 130. If the audio signal from the audio source 112 is already in digital form, then the upsampling processor operates on the digital input signal and produces an upsampled digital audio signal from the audio source 112. If instead the audio signal 112 in in analog form, the upsampling processor 130 may include an Analog-to-Digital Converter (ADC). In other embodiments, such an ADC may be separate from the upsampling processor 130.

Embodiments of the invention samples preferably samples the audio signal from the audio source at 384 kHz. At this rate, the sampling period is roughly 2.6 μs. This reduces the extra latency by an order of magnitude compared to the normal audio processing rates. Other embodiments may upsample the input audio signal at a sampling rate of between approximately 192 kHz and 768 kHz, for example. Other embodiments may sample at even higher rates.

After being upsampled, the audio input signal is passed to an ANC processor 140, which performs the ANC functions as described below. The ANC processor 140 includes an input 142 for receiving the upsampled audio input, and an output 144 for outputting an ANC compensated audio signal. The output 144 is sent to a Digital-to-Analog Converter (DAC) 150 for converting back into an audio signal, and then further to an amplifier 152, before being sent to the speaker 114.

As described above, the ANC system 100 includes inputs 160, 170 for feed-forward and feedback signals. These signals are converted to the digital domain through ADCs 170, 176, respectively, which in some embodiments may be delta-sigma ADCs running at 6.144 MHz, although other frequencies are possible. In general, though, the ADCs run at a frequency higher than the upsampler 130. Then, outputs from the ADCs 170, 176 are passed through a decimation filter 180 that outputs signal at 384 kHz in the preferred embodiment, to match the sample rate from the upsampler 130. Although in most embodiments the sampling frequency of the upsampler matches that of the decimator 180, it is not strictly necessary that they be matched.

Figure 5:
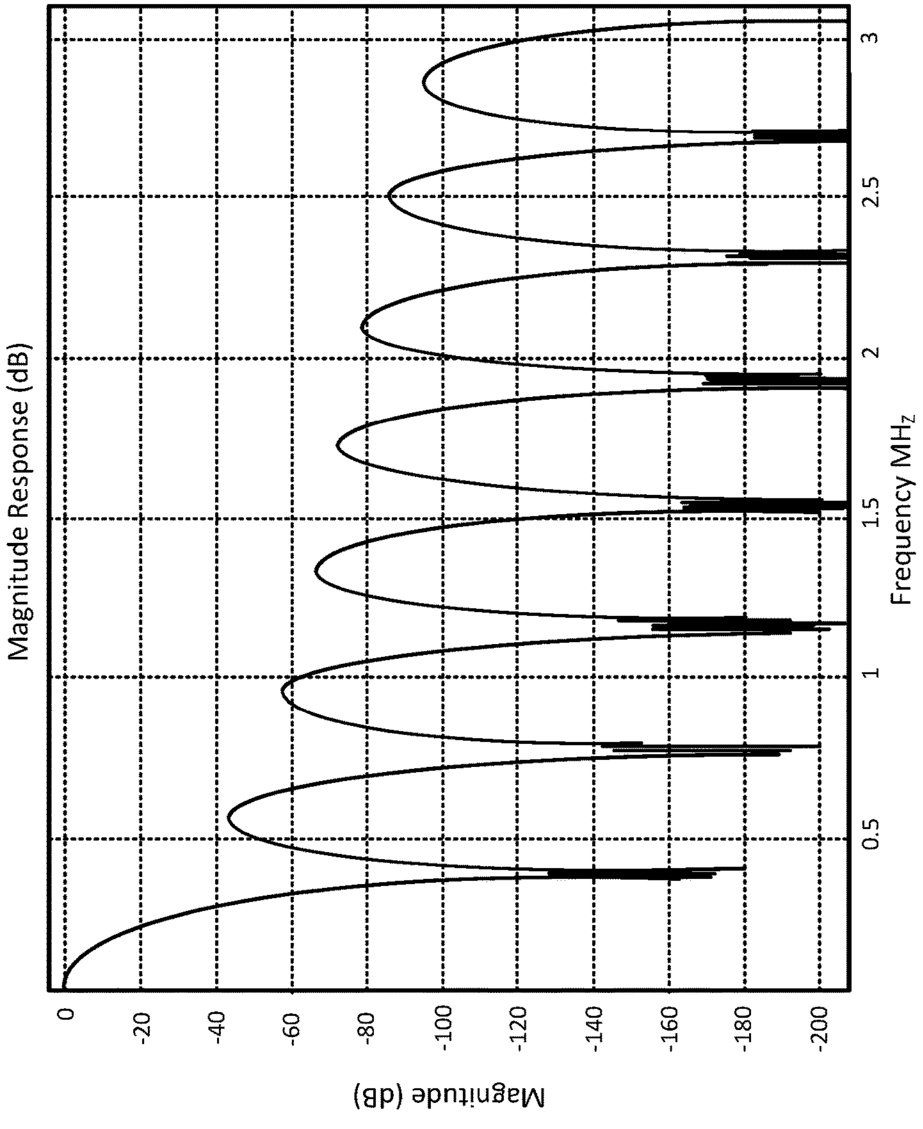
FIG. 5 is a diagram illustrating a frequency response for an example decimation filter according to embodiments of the invention.

The decimation filter 180 provides both decimation of the signals from the ADCs 170, 176 as well as filtering of those signals. The decimation filter 180 is designed for low latency. In one embodiment, the filter coefficients for the decimation filter effectively produce a modified sync type of filter, which focuses on removing signal only from the bands that might have aliased into the audible band upon decimation. In this way, the decimation filter 180 operates with lower latency than with typical decimation filter. A frequency response diagram for an example decimation filter 180 is illustrated as FIG. 5.

Outputs from the decimator 180 are fed to the ANC processor 140 as a feed-forward microphone input 190 and a feedback microphone input 196, respectively.

In operation, the ANC system 100 samples ambient noise through the feed-forward microphone 122 as well as speaker output through the feedback microphone 128. In general, these microphone samples are fed back to the ANC processor 140, which produces anti-noise signals from the microphone samples and combines them with the input audio signal to provide a noise-reduced audio output for the speaker 114. In other embodiments, depending on the operating mode and setup, only one of the microphones 122, 128 may be present. Detailed discussion of how the ANC processor 140 operates follows.

Figure 6:
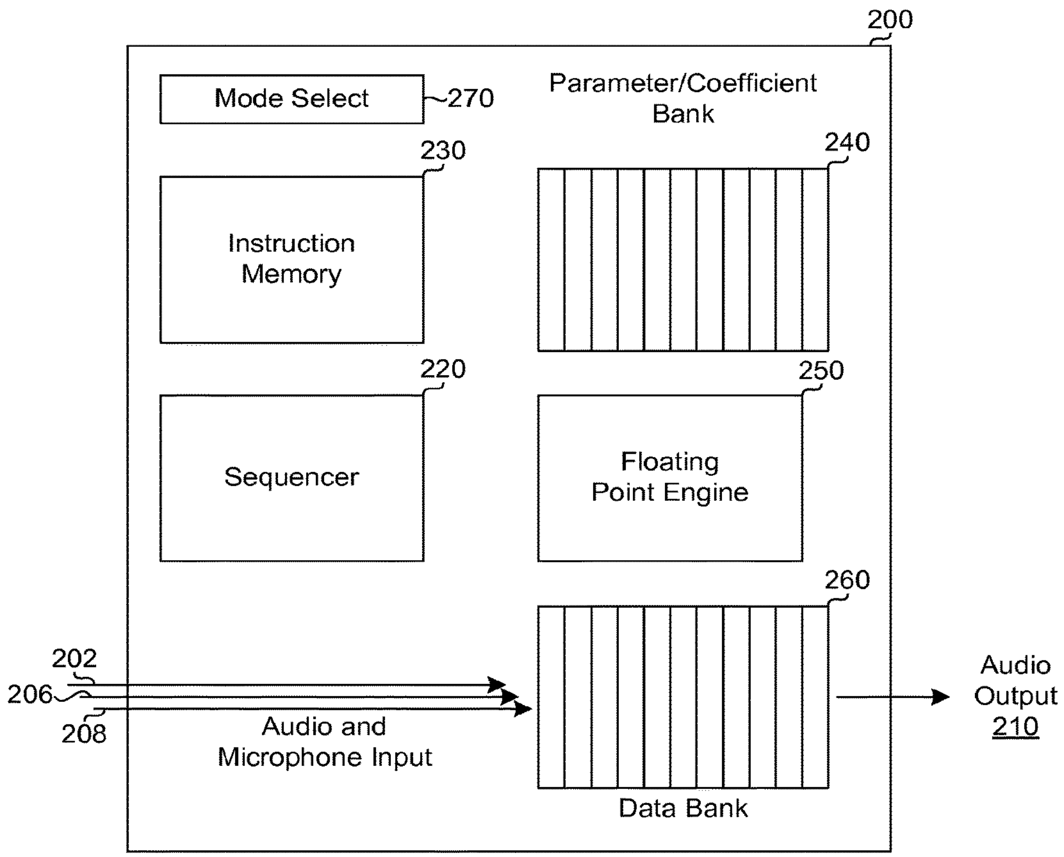
FIG. 6 is a functional block diagram of an example processor configured as a part of an Active Noise Cancellation system according to embodiments of the invention.

FIG. 6 is a functional block diagram of an example ANC processor 200 configured as a part of an Active Noise Cancellation system 200 according to embodiments of the invention. The ANC processor 200 may be an example embodiment of the ANC processor 140 of FIG. 4.

The ANC processor 200 includes audio input 202, as well as feed-forward microphone input 206 and feedback microphone input 208. It also includes audio output 210, which outputs an ANC-compensated output audio signal.

The ANC processor 200 further includes functions, processes, or operations for applying noise-cancellation signals to the input audio signal. In practice, these functions may be implemented by specially formed hardware circuits, as programmed functions operating on a general-purpose or special-purpose processor, such as a Digital Signal Processor (DSP), or may be implemented in Field Programmable Gate Arrays (FPGAs) or Programmable Logic Devices (PLDs). Other variations are also possible. In general, operations are described in FIG. 6 are illustrated as functional blocks, where each block describes functions performed by computer hardware, computer software, or various alternatives known in the art.

A sequencer 220 operates to execute functions in the ANC processor 200. The sequencer may operate on instructions stored in an instruction memory 230 that, when executed, perform the ANC function of the ANC processor 200.

Filter parameters are stored in a coefficient or parameter bank 240. In this way, many different filters or filtering functions may be stored within the ANC processor 200. This is much different that prior systems that only use a single or static filter during ANC. Embodiments of the invention, conversely, may store dozens or even hundreds of filter parameters in the parameter bank 240 or in other memory (not illustrated) in the ANC processor 200, or even outside the ANC processor. Particular parameters may be selected in association with a mode selector 270, which allows the ANC processor 200 to switch modes. In operation, the mode selector 270 may be used to switch between feed-forward ANC, feedback ANC, and combined feed-forward and feedback ANC. In other words, the ANC processor 200 is capable of operating in any of those modes. Switching between modes causes various filter parameters or coefficients to be retrieved from the parameter bank 240. The selected mode also causes particular codes to be loaded into the instruction memory 230 for operation by the sequencer 220. Then, in operation, the sequencer 220 steps through instruction memory 230 and operates in conjunction with a floating point engine 250. The floating point engine 250 stores or otherwise accesses the appropriate filter coefficients selected for the particular mode of operation. Then, as the inputs are received from the audio input 2012, as well as one or both of the microphone inputs 206, 208, data is created in a databank 260 by the floating point engine 250. The output of the ANC processor 200 is an ANC-compensated audio signal that has been modified by the selected filter parameters.

Figure 7:
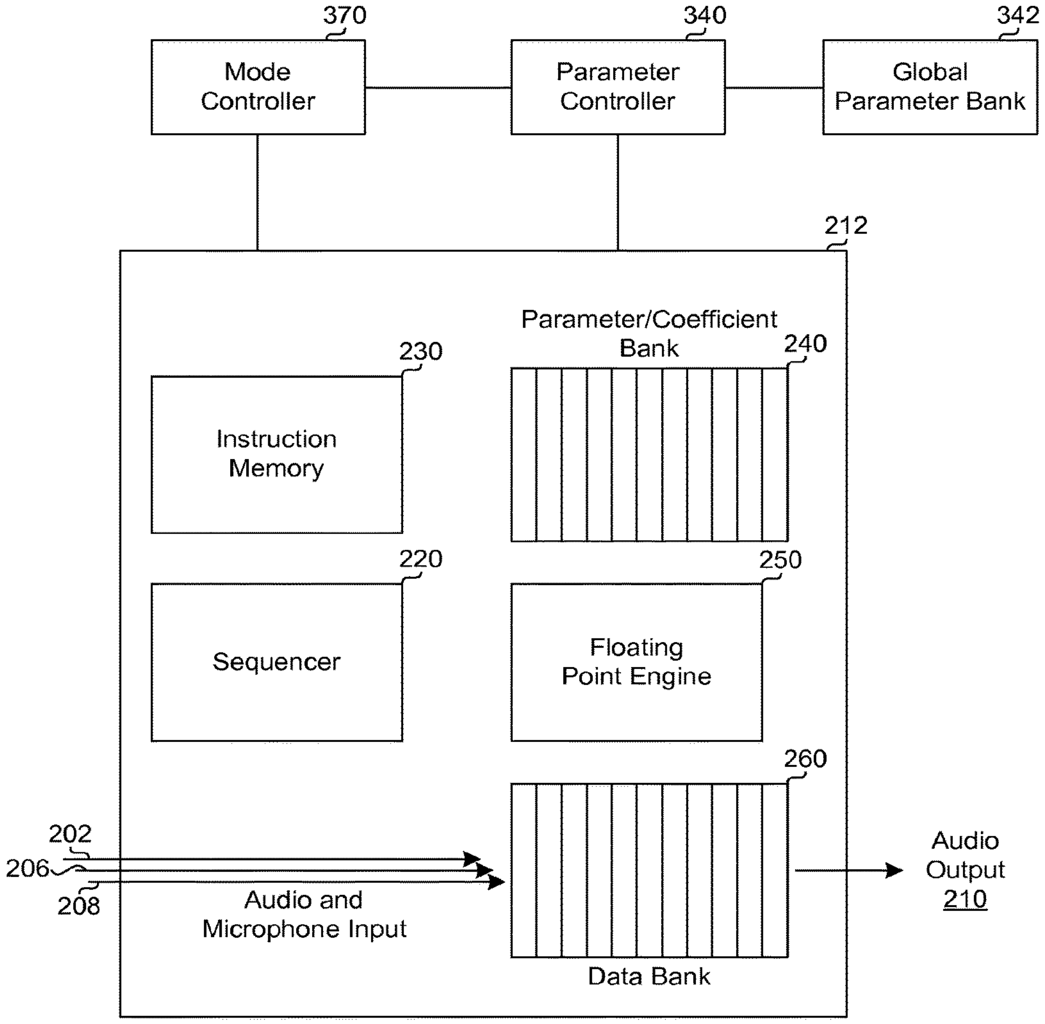
FIG. 7 is a functional block diagram of another example processor configured as a part of an Active Noise Cancellation system according to embodiments of the invention.

FIG. 7 is a functional block diagram of another example processor configured as a part of an Active Noise Cancellation system according to embodiments of the invention. In FIG. 7, an ANC processor 212 shares most of the components with the ANC processor 202 described above, the functions of which will not be repeated for brevity. The ANC processor 212 differs from that of ANC processor 202 in that the ANC processor 212 receives signals from a mode controller 370 as well as a parameter controller 340. In other words, a process outside of the ANC processor controls the mode selection and causes the mode controller 370 to store appropriate instructions in the instruction memory 230 based on the desired mode of the ANC processor 212. Similarly, a parameter controller 340 loads particular parameters or coefficients into the parameter/coefficient bank 240 based on the parameters to be used in the ANC processor. As described below, these parameters may change based on an initial system setup, or can be dynamically loaded into the parameter bank 240, or selected within the parameter bank 240, so that the ANC processor can dynamically change during operation.

The parameter controller 340 may store parameters internally or may be coupled to a global parameter bank 342 that stores parameters that may be chosen or selected by the parameter controller 340 for use in the ANC processor 212. The global parameter bank 342 may be formed of computer memory or other computer storage, for instance.

Figure 8:
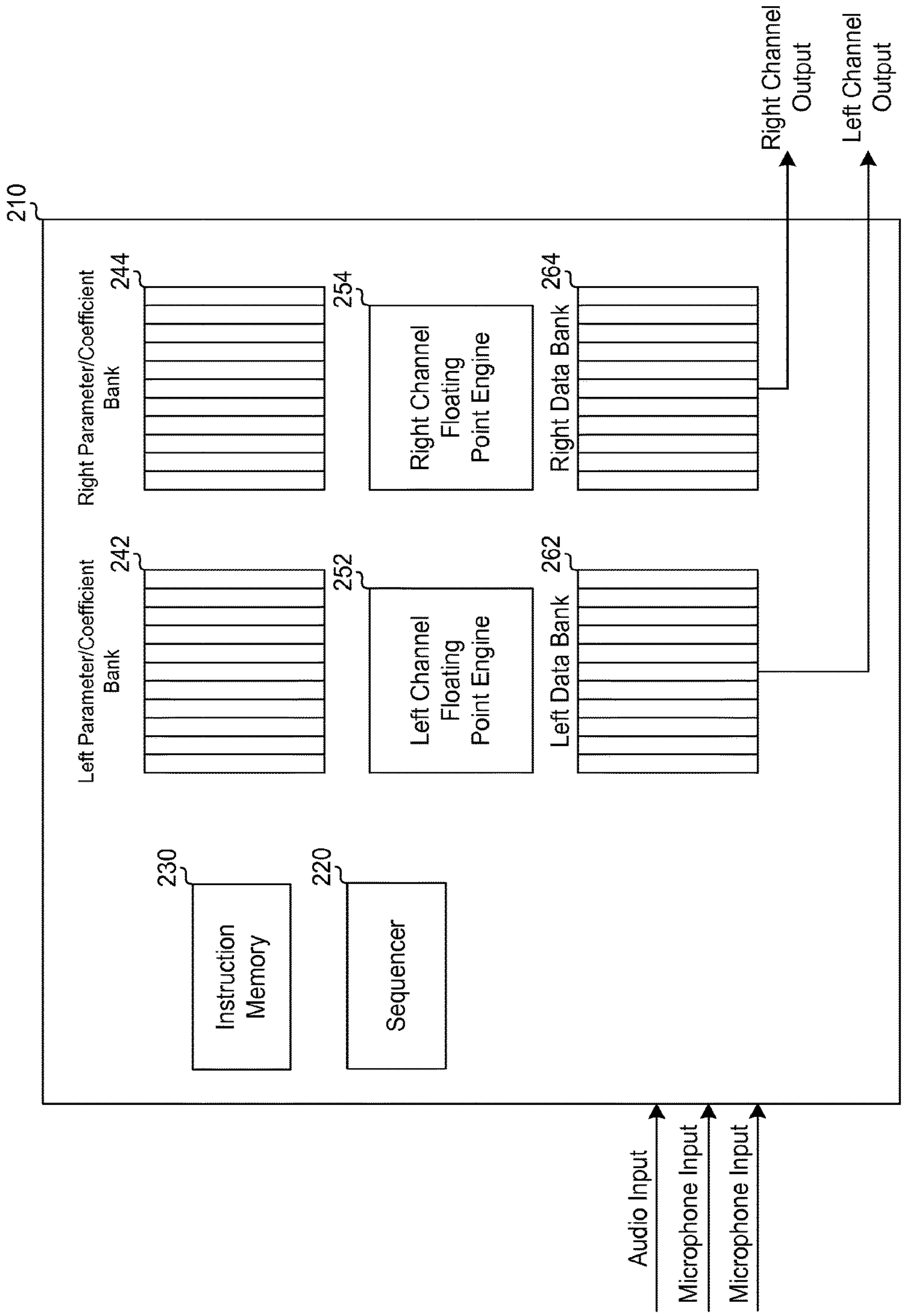
FIG. 8 is a functional block diagram of yet another example processor configured as a part of an Active Noise Cancellation system according to embodiments of the invention.

FIG. 8 is a functional block diagram of yet another example processor configured as a part of an Active Noise Cancellation system according to embodiments of the invention. An ANC processor 210 of FIG. 8 shares many components with the ANC processor 200 described above, the function of which will not be repeated here for brevity. The ANC processor 210 differs from the ANC processor 200 in that the processor 210 includes separate filtering paths for two audio channels, labeled here as left and right. More particularly, the ANC processor 210 includes left channel and right channel parameter coefficient banks 242, 244, left channel and right channel floating point engines 252, 254, and left and right data banks 262, 264. In general, the ANC processor 210 allows different filter parameters to be used for each of the two channels, tailoring the noise cancellation for each individual channel. For example, different filter parameters from the parameter/coefficient bank 242 and 244 may be used with the left floating point engine 252 and right floating point engine 254 to create data for the respective left and right data banks 262. 264. In other embodiments, the filter parameters may be stored in a single location and merely selected by the appropriate floating point engine 252, 254 for particular channel operation. As the filtering process occurs, data is populated into the left data bank 262 and right data bank 264, which is then used to create a left channel output and right channel output. Although the ANC processor 210 is shown having two channels, any number of channels may be supported using these concepts. For instance, each channel in quadrophonic or surround systems such as 5.1, 7.1, 9.1 or 11.1 systems may include particularized and independent separate ANC processing in such configured systems.

One advantage to such a system as that described above is that it can be used adaptively. Whereas conventional ANC engines include static parameters, embodiments of the invention can dynamically compute parameter values and write them into the parameter bank, such as the parameter bank 240 of FIG. 6. This allows the ANC processor to operate differently at different times, changing in real-time according to changing conditions.

Figure 9:
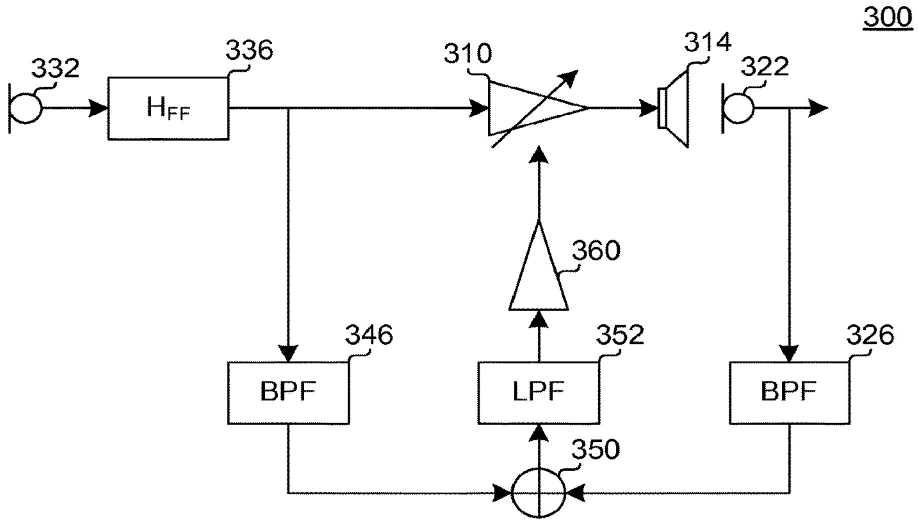
FIG. 9 is a functional block diagram illustrating an adaptive gain system for the Active Noise Cancellation according to embodiments of the invention.

One dynamic adaptation is adaptive ANC gain. FIG. 9 is a block diagram illustrating an example adaptive gain system 300 that can be used in embodiments of the invention. The adaptive gain system 300 of FIG. 9 includes a controllable amplifier 310 coupled to a speaker 314. A feedback microphone 322 samples the output of the speaker 314, and a feed-forward microphone 332 samples the listening environment, as described above. The feed-forward microphone 332 may be filtered by a feed-forward filter 336. Output from the feed-forward filter 336 is passed to a bandpass filter 346 while output from the feedback microphone 322 is passed to a bandpass filter 326. Outputs from the bandpass filters 326, 346 are compared in a correlator 350, and an output passed through a low pass filter 352 to an adaptivity controller 360, which controls the adaptive gain amplifier 310.

In operation, If the overall ANC gain is too low, the correlator 350 produces a positive result, which causes the adaptivity controller 360 to increase the gain of the adaptive gain amplifier 310. Conversely, if the ANC gain is too large, the noise signal will change signs, which also causes the output of the correlator 350 to produce a negative result. The negative output of the correlator 350 causes the adaptivity controller 360 to reduce the gain of the adaptive gain amplifier 310. The bandpass filters 326, 346 are selected to ensure that only the relevant spectrum of noise is considered for the calculations in the correlator 350. The lowpass filter 352 filters the output of the correlator 350 to cause a slow moving average to control the adaptivity controller 360.

Figure 10:
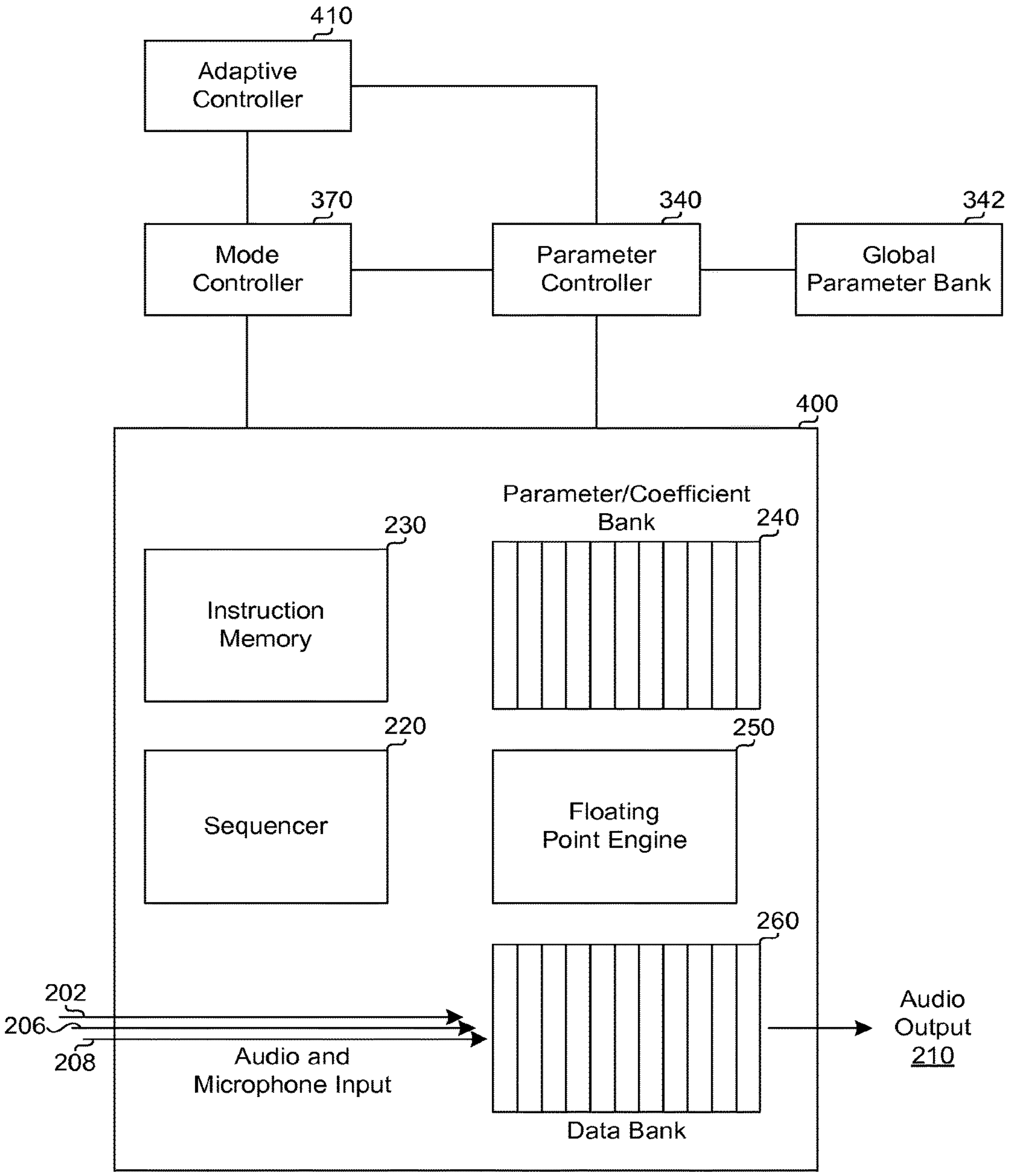
FIG. 10 is a functional block diagram of a processor configured as a part of an Active Noise Cancellation system having adaptive features, according to embodiments of the invention.

FIG. 10 illustrates an example adaptive ANC system. An ANC processor 400 is coupled to an external mode controller 370 and parameter controller 340. The ANC processor 400 may operate similar that to ANC processor 212 described above with reference to FIG. 7. The adaptive ANC system illustrated in FIG. 10, however, includes an adaptive controller 410 and is structured to operate in conjunction with the mode controller 370 and parameter controller 340 to load particular operations in the instruction memory 230 and parameter/coefficient bank 240 to change in response to changing conditions. These changes may be made in real-time and cause the ANC processor 400 to operate adaptively. The adaptive controller 410 may receive information from any source, including from the audio input 202 and the microphone inputs 206, 208. The adaptive controller 410 may operate according to pre-set set of instructions. For example, various features may be added to the adaptive controller 410 as advances in filtering algorithms and system operation are made.

Figure 11:
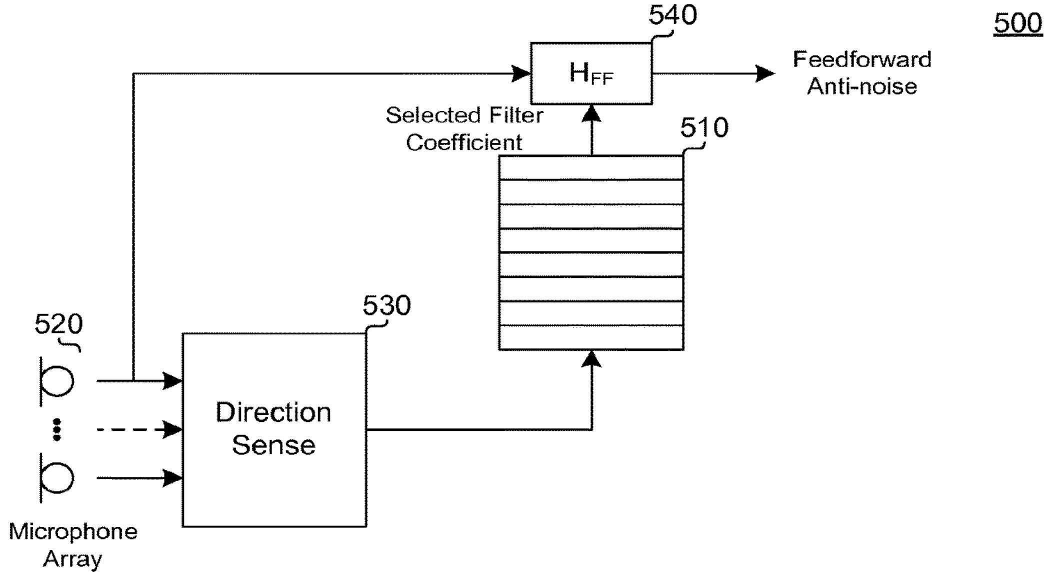
FIG. 11 is a functional block diagram illustrating an adaptive parameter selection system for the Active Noise Cancellation according to embodiments of the invention.

FIG. 11 is a block diagram of adaptive filtering that may be used in embodiments of the invention. An adaptive filter 500 may modify the feedforward performance of an ANC processor depending on a direction of the source of the detected noise. In this example, eight different sets of filter coefficients are stored in a filter store 510 where each filter coefficient is optimized for noise coming from a different direction, in, for example, 45-degree increments. A microphone array 520 is coupled to a direction sense detector 530, which uses the input from the microphones to determine the direction of the noise. The microphone array 520 may include several left and right feedforward microphones. Once the noise direction is determined, the filter coefficient that produces the best result is selected from the filter coefficients stored in the filter store 510 and stored as the feedforward filter 540. In this way ANC processor adapts to changing noise conditions. The functions illustrated in FIG. 11 may be performed in any of the ANC processors described above.

By using such techniques, any of the filters throughout the ANC system may be turned into adaptive filters. One example of adaptive filters includes selecting various filter parameters to apply a different level of filtering, over time. This could provide, for example, a feathering or fading effect to the noise cancelation or other effects of the ANC. For instance, cancelation effects may be faded in or out when the ANC function is turned on or off, rather than turning on or off abruptly.

In another example, filters may be chosen to enhance, rather than reduce certain sounds or noises. For instance, instead of parameters chosen for their ability to reduce sounds from a particular direction, as described above with reference to FIG. 11, parameters may be chosen that enhance particular sounds. For example, a person may be using ANC headphones in a noisy work environment with a variety of rumbling machinery, but still wants to be able to speak to a co-worker without removing the noise reducing headphones. Using the adaptive filter coefficients, when microphones detected noise in the vocal band, different parameters may be automatically loaded to the ANC system that enhanced the voice of the co-worker. Thus, the listener would have noise-canceling headphones that adaptively enhanced particular sounds. Sounds such as voices, audio television signals, and traffic, for example, may be enhanced. When such sounds went away, for example the co-worker stopped speaking, the standard filtering coefficients could again by dynamically loaded into the filters of the ANC system.

Embodiments of the invention may be incorporated into integrated circuits such as sound processing circuits, or other audio circuitry. In turn, the integrated circuits may be used in audio devices such as headphones, sound bars, audio docks, amplifiers, speakers, etc.

Having described and illustrated the principles of the invention with reference to illustrated embodiments, it will be recognized that the illustrated embodiments may be modified in arrangement and detail without departing from such principles, and may be combined in any desired manner. And although the foregoing discussion has focused on particular embodiments, other configurations are contemplated.

In particular, even though expressions such as "according to an embodiment of the invention" or the like are used herein, these phrases are meant to generally reference embodiment possibilities, and are not intended to limit the invention to particular embodiment configurations. As used herein, these terms may reference the same or different embodiments that are combinable into other embodiments.

Consequently, in view of the wide variety of permutations to the embodiments described herein, this detailed description and accompanying material is intended to be illustrative only, and should not be taken as limiting the scope of the invention.

What is claimed is:

1. An adaptive gain system, comprising:

a speaker;

a feedback microphone configured to sample the speaker;

a feed-forward microphone configured to sample a listening environment;

a controllable amplifier electrically coupled between the feed-forward microphone and the speaker;

an adaptivity controller electrically coupled with the controllable amplifier and configured to control the controllable amplifier based at least in part on output from the feedback microphone and output from the feed-forward microphone;

a correlator electrically coupled with the adaptivity controller and configured to cause the adaptivity controller to adjust a gain of the controllable amplifier; and a first band pass filter electrically coupled between the feedback microphone and the correlator.

2. The adaptive gain system according to claim 1, further comprising a second band pass filter electrically coupled between the feed-forward microphone and the correlator.

3. The adaptive gain system according to claim 2, wherein the correlator is configured to compare the outputs from the first and second band pass filters.

4. The adaptive gain system according to claim 3, wherein the correlator is configured to cause the adaptivity controller to adjust the gain of the controllable amplifier based on the comparing of the outputs from the first and second band pass filters.

5. The adaptive gain system according to claim 4, wherein the correlator is configured to cause the adaptivity controller to increase the gain of the controllable amplifier responsive to a positive output from the correlator.

6. The adaptive gain system according to claim 4, wherein the correlator is configured to cause the adaptivity controller to decrease the gain of the controllable amplifier responsive to a negative output from the correlator.

7. The adaptive gain system according to claim 4, further comprising a lowpass filter electrically coupled between the correlator and the adaptivity controller.

8. The adaptive gain system according to claim 7, wherein the lowpass filter is configured to filter an output of the correlator to cause a slow moving average to control the adaptivity controller.

* * * * *